United States Patent
Park et al.

(10) Patent No.: US 11,764,526 B2
(45) Date of Patent: Sep. 19, 2023

(54) MULTI-LINE INTERFACE FOR BOARD AND SUBSTRATE

(71) Applicant: QUALCOMM Incorporated, San Diego, CA (US)

(72) Inventors: Sang-June Park, San Diego, CA (US); Eric Lunzer, San Diego, CA (US); Peter Lien, Carlsbad, CA (US); Alberto Cicalini, Tortona (IT)

(73) Assignee: QUALCOMM INCORPORATED, San Diego, CA (US)

( * ) Notice: Subject to any disclaimer, the term of this patent is extended or adjusted under 35 U.S.C. 154(b) by 148 days.

(21) Appl. No.: 17/238,073

(22) Filed: Apr. 22, 2021

(65) Prior Publication Data
US 2022/0344881 A1    Oct. 27, 2022

(51) Int. Cl.
*H01R 24/50*    (2011.01)
*H01R 12/75*    (2011.01)
*H01R 13/518*   (2006.01)
*H01R 13/6594*  (2011.01)
*H01R 103/00*   (2006.01)

(52) U.S. Cl.
CPC ............. *H01R 24/50* (2013.01); *H01R 12/75* (2013.01); *H01R 13/518* (2013.01); *H01R 13/6594* (2013.01); *H01R 2103/00* (2013.01)

(58) Field of Classification Search
CPC ...... H01R 24/50; H01R 12/75; H01R 13/518; H01R 13/6594; H01R 2103/00
See application file for complete search history.

(56) References Cited

U.S. PATENT DOCUMENTS

2020/0350658 A1   11/2020  Park et al.
2021/0265790 A1*   8/2021  Nakagawa ............ H01R 13/40

FOREIGN PATENT DOCUMENTS

WO       2020085398 A1    4/2020

OTHER PUBLICATIONS

International Search Report and Written Opinion—PCT/US2022/023852—ISA/EPO—dated Jun. 30, 2022.

* cited by examiner

*Primary Examiner* — Abdullah A Riyami
*Assistant Examiner* — Justin M Kratt
(74) *Attorney, Agent, or Firm* — Loza & Loza, LLP

(57) ABSTRACT

A device that includes a first board, a second board, and coaxial cable coupled to the first board and the second board. The coaxial cable includes a multi-line coaxial cable configured to provide at least two electrical paths for electrical currents between the first board and the second board. A first plug is coupled to the first board. A second plug is coupled to the second board. The coaxial cable includes a first receptacle and a second receptacle. The first receptacle is configured to couple to the first plug. The second receptacle is configured to couple to the second plug. The coaxial cable is configured to provide (i) a first electrical path for a first electrical current between the first board and the second board, and (ii) a second electrical path for a second electrical current between the first board and the second board.

20 Claims, 12 Drawing Sheets

**BB CROSS SECTION
PROFILE VIEW

**BB CROSS SECTION
PROFILE VIEW

PROFILE VIEW

AA CROSS SECTION

AA CROSS SECTION

AA CROSS SECTION

AA CROSS SECTION

AA CROSS SECTION

AA CROSS SECTION

BOARD 202     210

*PLAN VIEW*

BOARD 202

*PLAN VIEW*

US 11,764,526 B2

MULTI-LINE INTERFACE FOR BOARD AND SUBSTRATE

FIELD

Various features relate to cables and interfaces for boards and substrates

BACKGROUND

An electronic device includes many electronic components that are near each other. These electronic components have signals that travel through them. These signals are sensitive to other signals and/or other electronic components. These signals may also leak. Reducing signal leakage and isolating signals from other nearby signals and/or electronic components is important. There is an ongoing need to improve signal isolation and reduce signal leakage in electronic devices.

SUMMARY

Various features relate to cables and interfaces for boards and substrates

One example provides a device that includes a board and a multi-line interface coupled to the board. The multi-line interface includes a receptacle and a plug configured to be coupled to the receptacle. The receptacle includes a first receptacle metal component configured as part of a first electrical path for a first current, a second receptacle metal component configured as part of a second electrical path for a second current. The plug includes a first plug metal component configured to be coupled to the first receptacle metal component, a second plug metal component configured to be coupled to the second receptacle metal component, and a plug metal frame configured as a shield around the first plug metal component and the second plug metal component.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a first board, a second board, and a coaxial cable coupled to the first board and the second board. The coaxial cable includes a multi-line coaxial cable configured to provide at least two electrical paths for electrical currents between the first board and the second board. A first plug is coupled to the first board. A second plug is coupled to the second board. The coaxial cable includes a first receptacle and a second receptacle. The first receptacle is configured to couple to the first plug. The second receptacle is configured to couple to the second plug. The coaxial cable is configured to provide (i) a first electrical path for a first electrical current between the first board and the second board, and (ii) a second electrical path for a second electrical current between the first board and the second board. The first electrical path between the first board and the second board is completely shielded (e.g., 360 degree shielded). The second electrical path between the first board and the second board is completely shielded. The first plug, the first receptacle, the coaxial cable, the second receptacle and the second plug are shielded. Electrical paths that are better shielded have reduced current and signal leakage, improved signal isolation, and provide currents and/or signals with better quality and integrity.

Exemplary Multi-Line Interface

Figure 1:
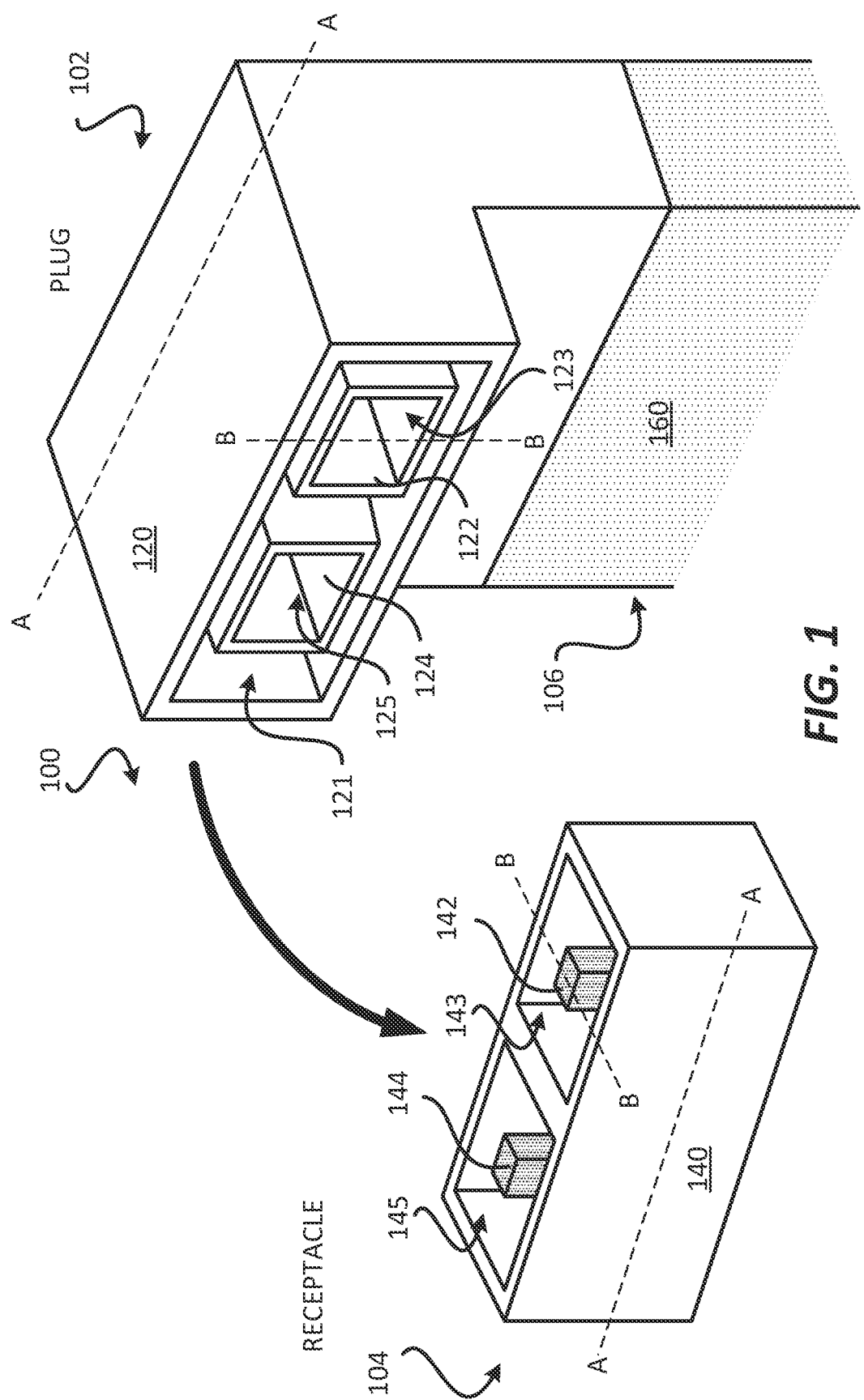
FIG. 1 illustrates a multi-line coaxial interface comprising a receptacle and a plug.

FIG. 1 illustrates an interface 100 that includes a plug 102 and a receptacle 104. The interface 100 may be a multi-line coaxial interface configured to provide at least two electrical paths for at least two signals, where each electrical path is shielded. The interface 100 may be a means for multi-line interface. The receptacle 104 is configured to be coupled (e.g., mechanically coupled) to the plug 102, and vice versa. The interface 100 may be a connector (e.g., multi-line coaxial connector). The plug 102 and the receptacle 104 may be separate components that may be coupled to each other and may be detachable from each other. The plug 102 may be a means for plug coupling. The receptacle 104 may be a means for receptacle coupling. When the receptacle 104 and the plug 102 are coupled to each other, the receptacle 104 and the plug 102 may allow at least two electrical currents to pass through the receptacle 104 and the plug 102 (in either direction). As will be further described below, at least one interface 100 may be used to provide fully shielded electrical paths between two boards and/or two substrates, for at least two electrical currents (e.g., electrical signals).

The plug 102 may be a multi-line coaxial plug. The plug 102 includes a metal frame 120, a chamber 121, a first support component 122, a first region 123, a second support component 124, and a second region 125. The plug 102 is coupled to a cable 106 (or is part of the cable 106). The cable 106 may be a multi-line coaxial cable. The cable 106 may include a flexible cable. The cable 106 includes a cover 160. As will be further described below, the plug 102 and/or the cable 106 may include other components.

The metal frame 120 may be a plug metal frame. The metal frame 120 may be configured to be coupled to ground (e.g., electrical ground). The metal frame 120 may be configured as a shield (e.g., electromagnetic interference (EMI) shield). The first support component 122 and the second support component 124 may be surrounded by the metal frame 120. More specifically, the first support component 122 and the second support component 124 may be located in the chamber 121. The chamber 121 may be defined by the metal frame 120. The first support component 122 and/or the second support component 124 may include non-metal material (e.g., plastic material). The first support component 122 and/or the second support component 124 may be flexible. The first support component 122 may have a rectangular cross section (e.g., square cross section). The first region 123 may be defined by the first support component 122. The second support component 124 may have a rectangular cross section (e.g., square cross section). The second region 125 may be defined by the second support component 124. As will be further described below, the plug 102 may include a first plug metal component and a second plug metal component.

The receptacle 104 may be a multi-line coaxial receptacle. The receptacle 104 includes a metal frame 140, a first metal component 142, a second metal component 144, a first region 143, and a second region 145. The first metal component 142 may be a first receptacle metal component. The second metal component 144 may be a second receptacle metal component. As will be further described below, the receptacle 104 may include other components. The receptacle 104 may be configured to be coupled to a board (e.g., printed circuit board, first board, second board) or a substrate. Different implementations may couple the receptacle 104 to a board or a substrate differently. For example, solder may be used to couple the receptacle 104 to a board or a substrate.

The metal frame 140 may be a receptacle metal frame. The metal frame 140 may be configured as a shield (e.g., electromagnetic interference (EMI) shield). The metal frame 140 may be configured to couple to ground (e.g., electrical ground). The first metal component 142 (e.g., first receptacle metal component) and the second metal component 144 (e.g., second receptacle metal component) may be surrounded by the metal frame 140. The first metal component 142 may be located in the first region 143. The second metal component 144 may be located in the second region 145. A portion of the metal frame 140 may separate the first region 143 and the second region 145. The same portion of the metal frame 140 may be located between the first metal component 142 and the second metal component 144. The metal frame 140 may be configured as a shield for (i) a first electrical current that passes through the first metal component 142, and (ii) a second electrical current that passes through the second metal component 144. The metal frame 140 may be configured to provide 360-degree shielding for (i) a first electrical current that passes through the first metal component 142, and (ii) a second electrical current that passes through the second metal component 144. The metal frame 140 may be configured to isolate currents passing through the first metal component 142 from currents passing through the second metal component 144, and vice versa. The metal frame 140 may be configured to reduce current leakage passing through the first metal component 142 and/or the second metal component 144. The first electrical current may include a first radio frequency (RF) signal and/or a first intermediate frequency (IF) signal. The second electrical current may include a second radio frequency (RF) signal and/or a second intermediate frequency (IF) signal. Examples of signal frequencies include millimeters wave frequencies. Examples of signal frequencies includes frequencies up to 50 GHz (e.g., 1 GHz to 50 GHz) that may pass through with improved isolation and reduced signal leakage. Improvements in signal isolation is further described below in at least FIGS. 15 and 16.

The plug 102 is configured to be coupled to the receptacle 104, and vice versa. When the plug 102 is coupled to the receptacle 104, the metal frame 140 may be located in the chamber 121 of the plug 102. The metal frame 140 may be coupled (e.g., mechanically coupled, electrically coupled) to the metal frame 120. The first metal component 142 may be located in the first region 123 of the plug 102. The second metal component 144 may be located in the second region 125 of the plug 102. Tension and pressure between the plug 102 and the receptacle 104 may be used to securely couple the plug 102 and the receptacle 104 together.

Figure 2:
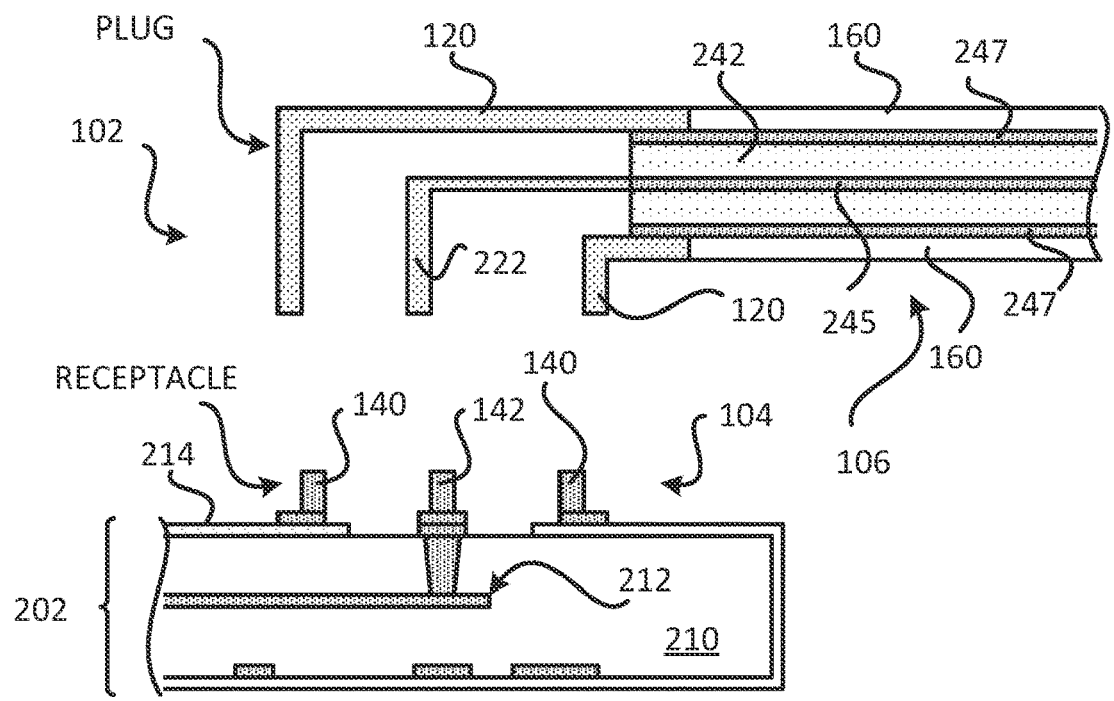
FIG. 2 illustrates a multi-line coaxial interface comprising a receptacle and a plug coupled to a board.

FIG. 2 illustrates a profile view of a receptacle coupled to a board across a BB cross section. FIG. 2 also illustrates a profile view of a plug across a BB cross section. As shown in FIG. 2, the receptacle 104 is coupled to the board 202 (e.g., printed circuit board). Different implementations may couple the receptacle 104 to a board differently. For example, solder may be used to couple the receptacle 104 to the board 202. It is noted that the receptacle 104 may be coupled to a substrate. The board 202 includes at least one dielectric layer 210, a plurality of interconnects 212, and a metal layer 214. The metal layer 214 may be located on at least one surface of the at least one dielectric layer 210. The metal layer 214 may be located over an outer surface of the board 202. The receptacle 104 is coupled to a first surface (e.g., top surface) of the board 202. The metal frame 140 is coupled to the metal layer 214 of the board 202. Different implementations may couple the metal frame 140 to the metal layer 214 differently. The first metal component 142 is coupled to a first plurality of interconnects from the plurality of interconnects 212 of the board 202. The first plurality of interconnects from the plurality of interconnects 212 of the board 202 may include interconnects located in the at least one dielectric layer 210. Although not shown, the second metal component 144 may be coupled to a second plurality of interconnects from the plurality of interconnects 212 of the board 202. The second plurality of interconnects from the plurality of interconnects 212 of the board 202 may include interconnects located in the at least one dielectric layer 210. The metal frame 140 and the metal layer 214 are configured to be coupled to ground (e.g., electrical ground). The metal frame 140 and the metal layer 214 are configured to as a shield (e.g., electromagnetic interference (EMI) shield).

FIG. 2 also illustrates a plug coupled to a cable. As shown in FIG. 2, the plug 102 is coupled to the cable 106. In some implementations, the plug 102 may be considered part of the cable 106. The plug 102 includes the metal frame 120 and a first metal component 222. The first metal component 222 (e.g., first plug metal component) may be located in the first region 123 of the plug 102. Although not shown, the plug 102 may also include a second metal component (e.g., second plug metal component). The cable 106 incudes the cover 160, a dielectric layer 242, a first metal layer 245, and a metal layer 247. The cable 106 may also include a second metal layer (not shown). The metal frame 120 is coupled to the metal layer 247. The metal layer 247 may radially surround the first metal layer 245 and/or a second metal layer (not shown and is configured as a second electrical path for a second current). The first metal component 222 is coupled to the first metal layer 245. A second metal component (not shown) of the plug 102 may be coupled to a second metal layer of the cable 106. The second metal component may be similar to the first metal component 222. The second metal component may be a second plug metal component. The second metal component may be located in the second region 125 of the plug 102. In some implementations, the second metal component (which is not shown in FIG. 2) may be represented as the second metal component 224 and/or the second metal component 824, which are further described below in at least FIGS. 6 and 10.

Figure 3:
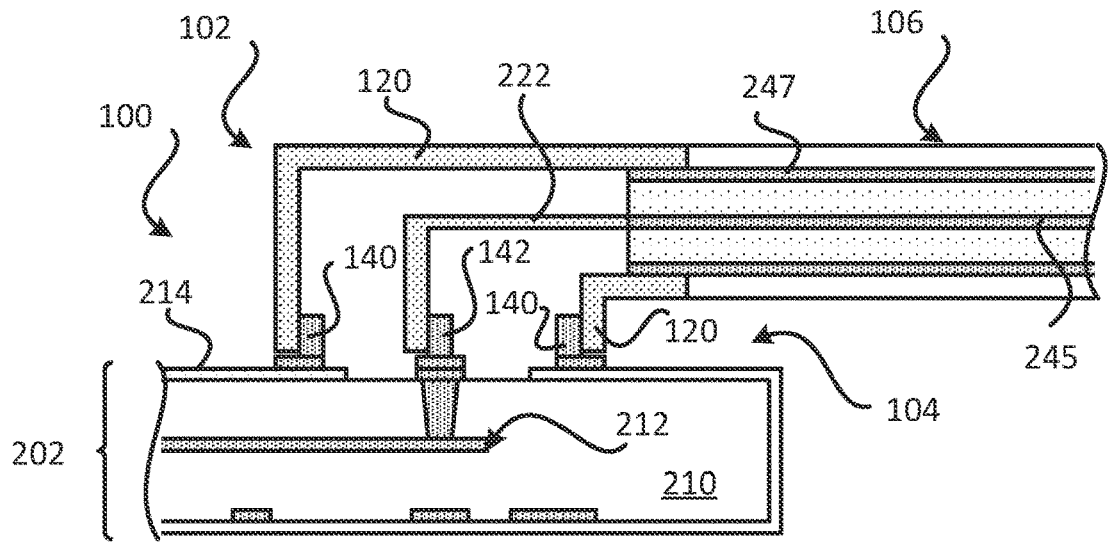
FIG. 3 illustrates a multi-line coaxial interface comprising a receptacle and a plug coupled to a board.

FIG. 3 illustrates a profile view across a BB cross section of a plug coupled to a receptacle. As shown in FIG. 3, the plug 102 is coupled (e.g., mechanically coupled, electrically coupled) to the receptacle 104, and vice versa. Tension and/or pressure between the plug 102 and the receptacle 104 may securely hold them together. The metal frame 120 of the plug 102 is coupled to the metal frame 140 of the receptacle 104. The first metal component 142 is coupled to the first metal component 222 of the plug 102. The first metal component 222 may be a first plug metal component. When the plug 102 is coupled to the receptacle 104, at least two electrical paths may exist that extends through the cable 106, the plug 102, the receptacle 104 and the board 202. For example, a first electrical path may be defined by the first metal layer 245, the first metal component 222, the first metal component 142, and/or a first plurality of interconnects from the plurality of interconnects 212. A second electrical path (and any additional electrical paths) may be defined in a similar manner as the first electrical path. Moreover, the first electrical path and the second electrical path are fully shielded by the metal layer 247, the metal frame 120, the metal frame 140, at least one interconnect from the plurality of interconnects 212 and/or the metal layer 214. For example, the interconnects from the plurality of interconnects 212, which may include interconnects located in the board 202 (e.g., located in the at least one dielectric layer 210), may be shielded by the metal layer 214 of the board 202.

Figure 4:
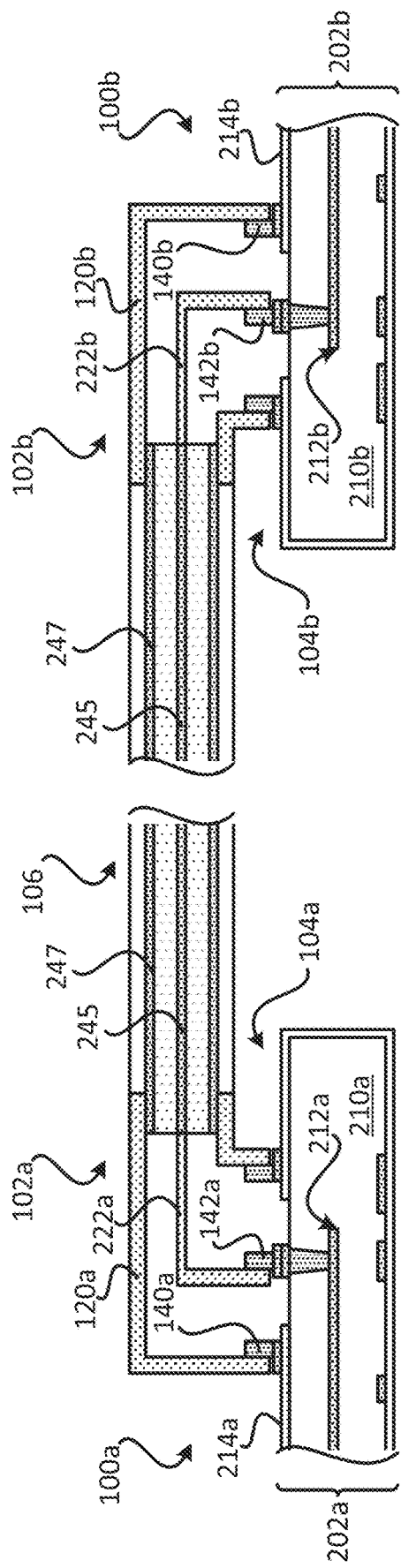
FIG. 4 illustrates a multi-line coaxial cable coupled to two boards.

FIG. 4 illustrates how a multi-line coaxial cable with multi-line coaxial interfaces may be used to couple two boards. FIG. 4 illustrates a first board 202a, a second board 202b, and the cable 106. The first board 202a is coupled (e.g., mechanically coupled, electrically coupled) to the second board 202b through the cable 106. The cable 106 includes a first plug 102a and a second plug 102b. It is noted that in some implementations, the first plug 102a and/or the second plug 102b may be considered as separate components from the cable 106. A first receptacle 104a is coupled to the first board 202a. A second receptacle 104b is coupled to the second board 202b. A first interface 100a may include the first plug 102a and the first receptacle 104a. A second interface 100b may include the second plug 102b and the second receptacle 104b.

A first electrical path between the first board 202a and the second board 202b may include (i) a first plurality of interconnects from the plurality of interconnects 212a of the first board 202a, (ii) a first metal component 142a from the first receptacle 104a, (iii) a first metal component 222a from the first plug 102a, (iv) a first metal layer 245 from the cable 106, (v) a first metal component 222b from the second plug 102b, (vi) a first metal component 142b from the second receptacle 104b, and (vii) a first plurality of interconnects from the plurality of interconnects 212b of the second board 202b. The first electrical path may be for a first electrical current (e.g., first electrical signal).

A second electrical path between the first board 202a and the second board 202b may include a similar path as described for the first electrical path above. The second electrical path may be for a second electrical current (e.g., second electrical signal). The first electrical path (and any other electrical paths) between the first board 202a and the second board 202b may be fully shielded (e.g., 360-degree shielded). Full shielding provides better isolation between signals, reduces current and/or signal leakage, which may lead to better signal integrity and quality. Examples of how fully shielding one or more electrical paths can improve signal performance are further illustrated and described below in at least FIGS. 15 and 16.

The shielding of currents traveling through the electrical paths between the first board 202a and the second board 202b may be provided by (i) a metal layer 214a of the board 202a, (ii) a metal frame 140a of the first receptacle 104a, (iii) a metal frame 120a of the first plug 102a, (iv) a metal layer 247 of the cable 106, (v) a metal frame 120b of the second plug 102b, (vi) a metal frame 140b of the second receptacle 104b, and/or (vii) a metal layer 214b of the second board 202b. The metal layer 214a of the board 202a, the metal frame 140a of the first receptacle 104a, the metal frame 120a of the first plug 102a, the metal layer 247 of the cable 106, the metal frame 120b of the second plug 102b, the metal frame 140b of the second receptacle 104b, and/or the metal layer 214b of the second board 202b may be coupled to ground (e.g., electrical ground). The first board 202a may include at least one dielectric layer 210a. The second board 202b may include at least one dielectric layer 210b. It is noted that instead of boards, the multi-line coaxial cable with multi-line coaxial interfaces of FIG. 4 may be used to couple two substrates, and/or a combination of a board and a substrate.

Figure 5:
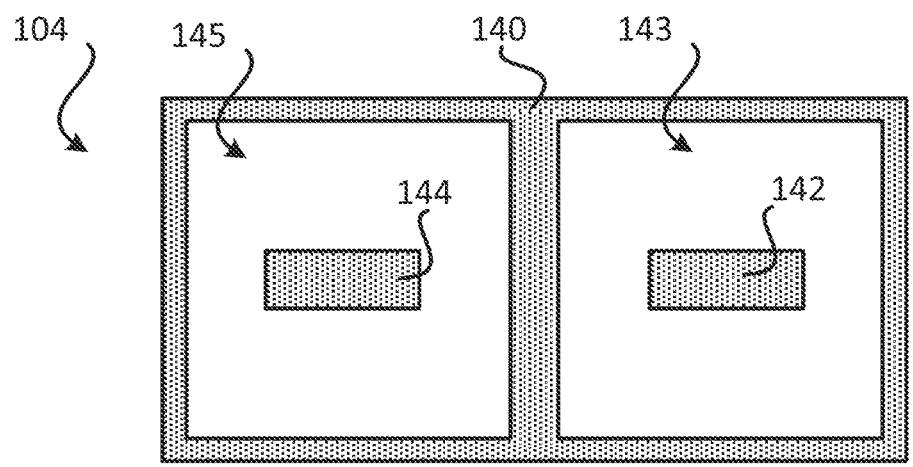
FIG. 5 illustrates a cross sectional view of a receptacle for a multi-line coaxial interface.

FIG. 5 illustrates an exemplary AA cross sectional view of a receptacle. As shown in FIG. 5, the receptacle 104 includes the metal frame 140, the first metal component 142, and the second metal component 144. The first metal component 142 is located in the first region 143 of the receptacle 104. The second metal component 144 is located in the second region 145 of the receptacle 104. The metal frame 140 is configured to provide 360-degree shielding (e.g., 360-degree EMI shielding) for the currents traveling through the first metal component 142 and the second metal component 144. Moreover, a portion of the metal frame 140 may separate and help isolate currents traveling through the first metal component 142 from currents traveling through the second metal component 144. The metal frame 140 is configured to be coupled to ground.

Figure 6:
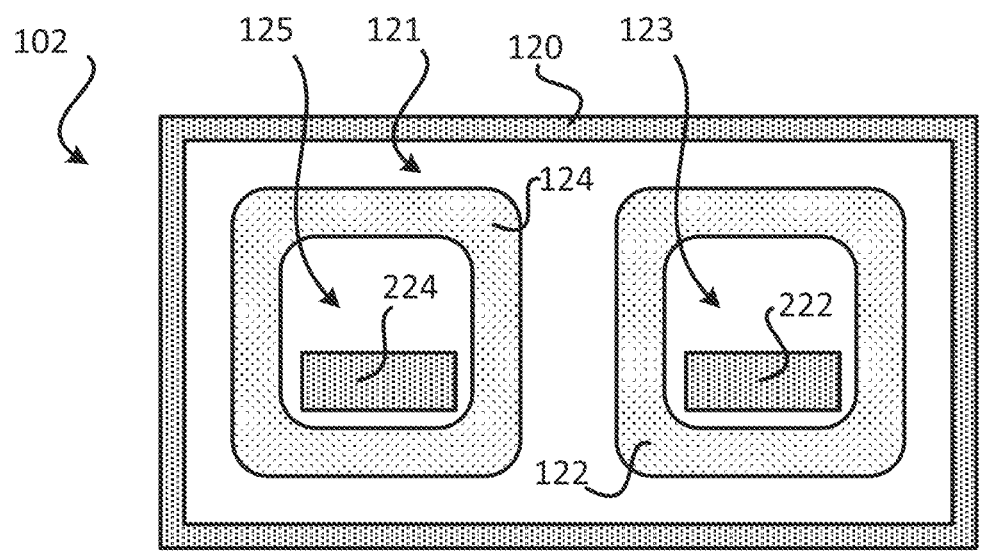
FIG. 6 illustrates a cross sectional view of a plug for a multi-line coaxial interface.

FIG. 6 illustrates an exemplary AA cross sectional view of a plug. As shown in FIG. 6, the plug 102 includes the metal frame 120, the chamber 121, the first support component 122, the second support component 124, the first metal component 222 (e.g., first plug metal component), and the second metal component 224 (e.g., second plug metal component). The first support component 122 and the second support component 124 are located in the chamber 121. The first region 123 may be defined by the first support component 122. The second region 125 may be defined by the second support component 124. The first support component 122 and the second support component 124 may each be flexible components. The first metal component 222 may be located in the first region 123. The second metal component 224 may be located in the second region 125.

Figure 7:
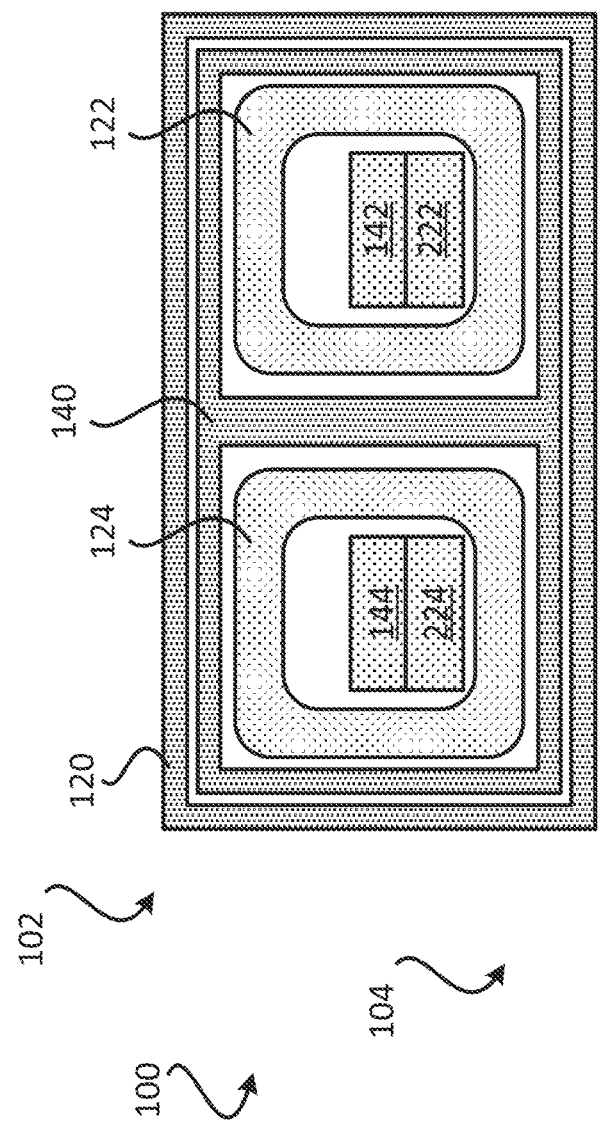
FIG. 7 illustrates a cross sectional view of a receptacle and a plug for a multi-line coaxial interface.

FIG. 7 illustrates an exemplary AA cross sectional view of the plug 102 and the receptacle 104 coupled to each other. As shown in FIG. 7, the receptacle 104 may be at least partially located in the plug 102. The receptacle 104 may be located in the chamber 121 of the plug 102. The first metal component 142 of the receptacle 104 may be located in the first region 123 of the plug 102. The first metal component 142 (e.g., first receptacle metal component) may be coupled to the first metal component 222 (e.g., first plug metal component). The second metal component 144 of the receptacle 104 may be located in the second region 125 of the plug 102. The second metal component 144 (e.g., second receptacle metal component) may be coupled to the second metal component 224 (e.g., second plug metal component). The metal frame 140 of the receptacle 104 may touching the metal frame 120 of the plug 102. In some implementations, the combined cross-sectional size of the plug 102 and the receptacle 104 may be about 3.6 mm (L)×2.4 mm (W), or less.

Figure 8:
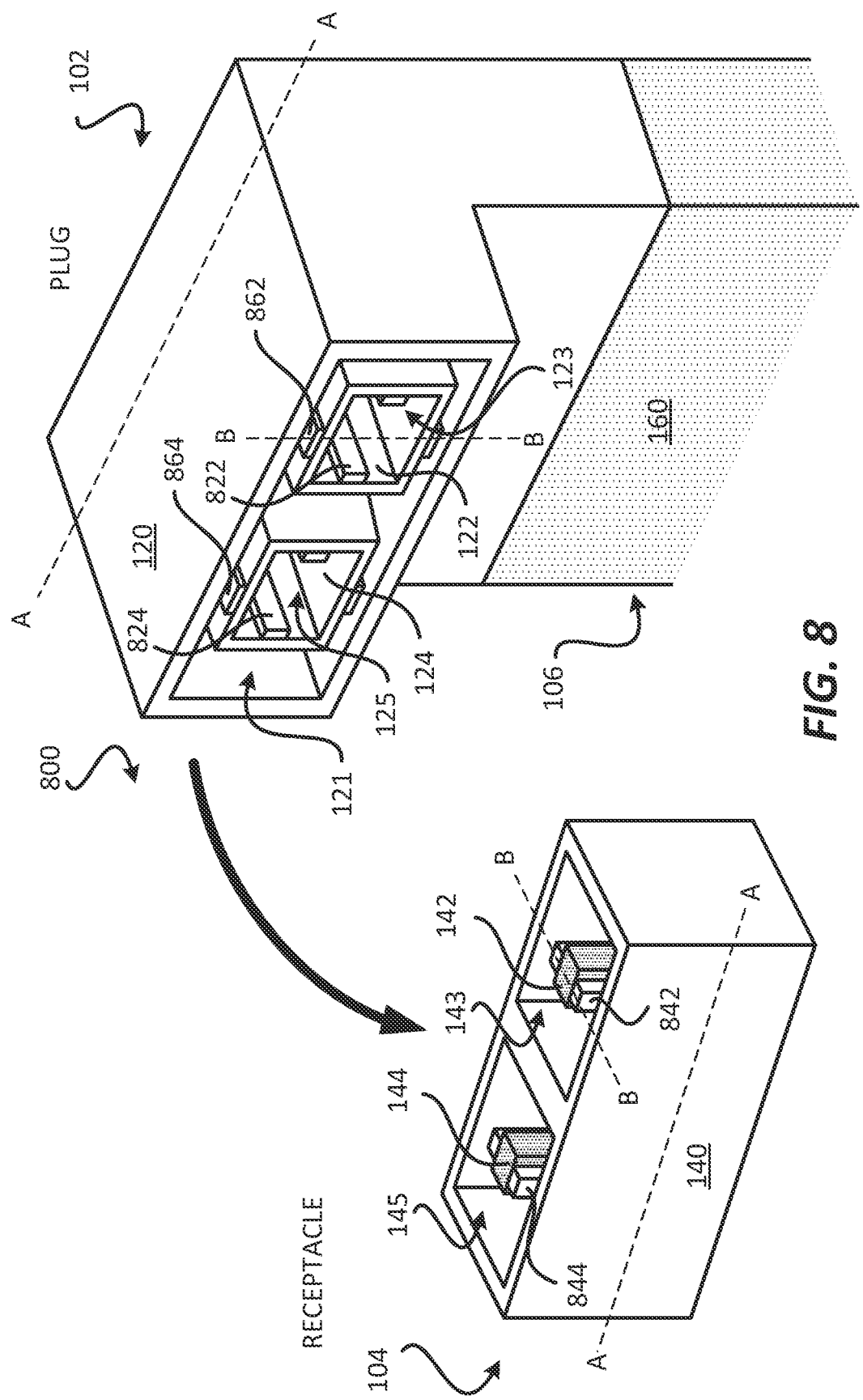
FIG. 8 illustrates a multi-line coaxial interface comprising a receptacle and a plug.
Figure 9:
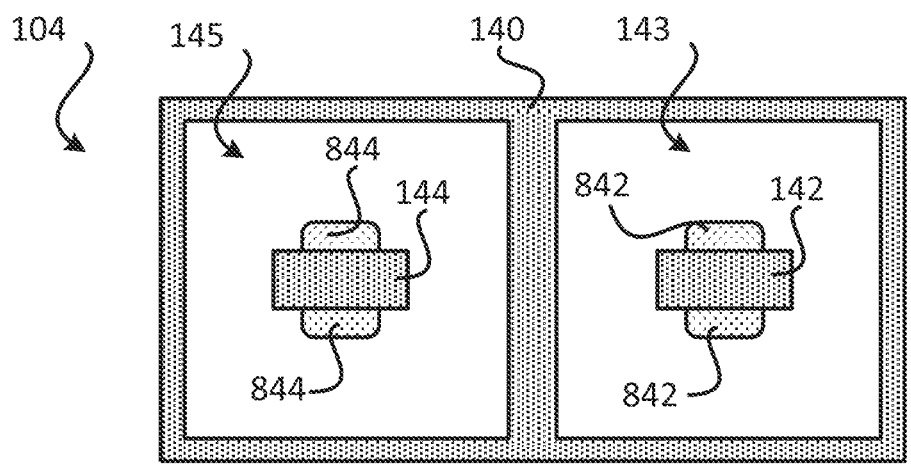
FIG. 9 illustrates a cross sectional view of a receptacle for another multi-line coaxial interface.
Figure 10:
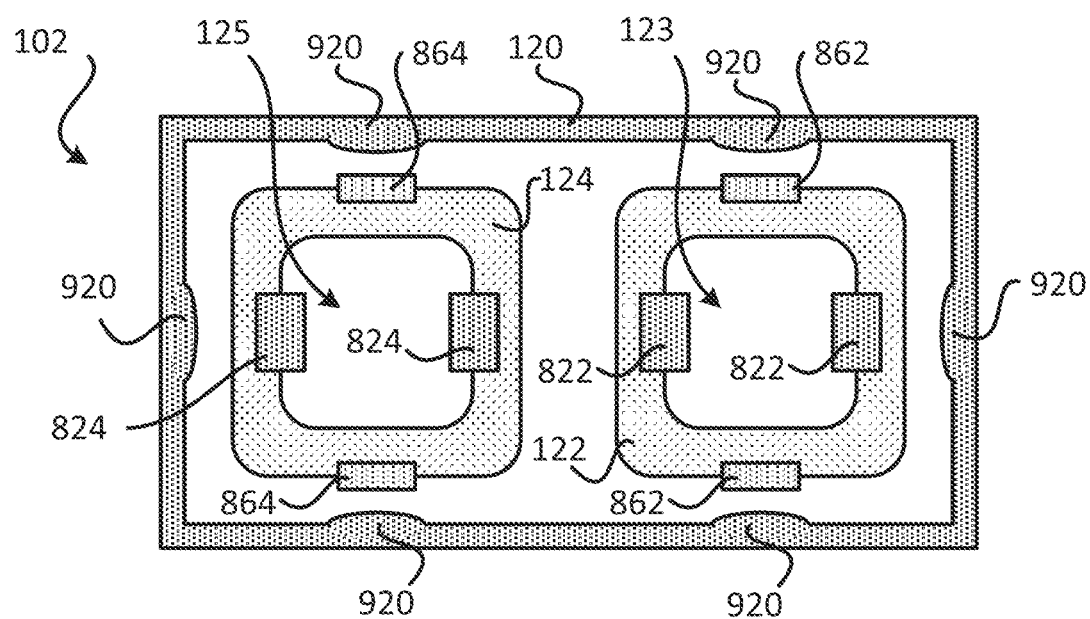
FIG. 10 illustrates a cross sectional view of a plug for another multi-line coaxial interface.

It is noted that the location, size and/or shapes of the various components of the receptacle 104 and the plug 102 may vary with different implementations. Moreover, the various components may be coupled to each other in various ways, and is not limited by what is shown and described in the disclosure. For example, FIG. 7 illustrates that a side portion of the first metal component 142 is coupled to a side portion of the first metal component 222. However, the first metal component 142 may couple to the first metal component 222 through other portions. As mentioned above, a receptacle and/or a plug may include more components than the components mentioned above. FIGS. 8-10 illustrate an exemplary receptacle and an exemplary plug with additional components. In some implementations, the receptacle and the plug of FIGS. 8-10 provide more robust and reliable coupling.

FIG. 8 illustrates an interface 800 that includes the plug 102 and the receptacle 104. The interface 800 may be a multi-line coaxial interface configured to provide at least two electrical paths for at least two signals, where each electrical path is shielded (EMI shielded). The receptacle 104 is configured to be coupled (e.g., mechanically coupled, electrically coupled) to the plug 102, and vice versa. The interface 800 may be a means for multi-line interface. The plug 102 may be a means for plug coupling. The receptacle 104 may be a means for receptacle coupling. The interface 800 is similar to the interface 100 of FIG. 1. However, the interface 800 may include different configurations of components and/or additional components. As shown in FIG. 8, the receptacle 104 includes the metal frame 140, the first metal component 142, the second metal component 144, at least one first support component 842, and at least one second support component 844. FIG. 8 illustrates that the plug 102 includes the metal frame 120, the chamber 121, the first support component 122, the second support component 124, at least one first metal component 822, at least one first metal ground component 862, at least one second metal component 824, and at least one second metal ground component 864.

FIG. 9 illustrates an exemplary AA cross sectional view of the receptacle 104 of FIG. 8. As shown in FIG. 9, the receptacle 104 includes the metal frame 140, the first metal component 142, the second metal component 144, at least one first support component 842, and at least one second support component 844. The first metal component 142 and the first support component 842 are located in the first region 143 of the receptacle 104. The second metal component 144 and the second support component 844 are located in the second region 145 of the receptacle 104. The first support component 842 and/or the second support component 844 may include non-metal material (e.g., plastic material). The first support component 842 and/or the second support component 844 may each be flexible. The first support component 842 is coupled to the first metal component 142. The second support component 844 may be coupled to the second metal component 144. As will be further described below, the at least one first support component 842 and/or the at least one second support component 844 may help provide a more secure coupling between a receptacle and a plug.

FIG. 10 illustrates an exemplary AA cross sectional view of the plug 102 of FIG. 8. As shown in FIG. 10, the plug 102 includes the metal frame 120, the chamber 121, the first support component 122, the second support component 124, at least one first metal component 822, at least one first metal ground component 862, at least one second metal component 824, and at least one second metal ground component 864. The first metal component 822 may be a first plug metal component. The second metal component 824 may be a second plug metal component. In some implementations, the first metal component 822 may be represented as the first metal component 222. The metal frame 120 may include one or more protrusions 920. A protrusion may include a bump in the metal frame 120.

Figure 11:
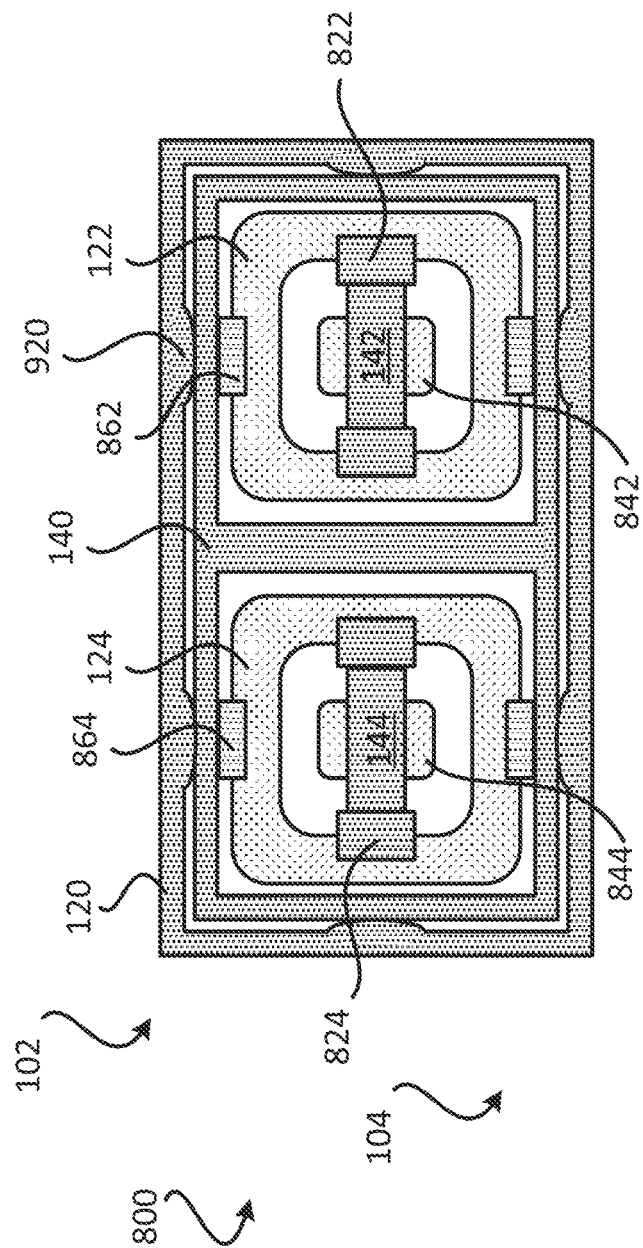
FIG. 11 illustrates a cross sectional view of a receptacle and a plug for another multi-line coaxial interface.

FIG. 11 illustrates an exemplary AA cross sectional view of the plug 102 and the receptacle 104 of FIG. 8, coupled to each other. As shown in FIG. 11, the receptacle 104 may be at least partially located in the plug 102. The receptacle 104 may be located in the chamber 121 of the plug 102. The metal frame 120 of the plug 102 may be coupled to the metal frame 140 of the receptacle 104. For example, the protrusions 920 of the metal frame 120 may be coupled to the metal frame 140 of the receptacle 104. The first metal component 822 (e.g., first plug metal component) of the plug 102 may be coupled to the first metal component 142 (e.g., first receptacle metal component) of the receptacle 104. The first metal ground component 862 of the plug 102 may be coupled to the metal frame 140 of the receptacle 104. The second metal component 824 (e.g., second plug metal component) of the plug 102 may be coupled to the second metal component 144 (e.g., second receptacle metal component) of the receptacle 104. The second metal ground component 864 of the plug 102 may be coupled to the metal frame 140 of the receptacle 104. In some implementations, the first support component 122 may bend and/or flex to allow the various components to fit and/or couple with each other. Similarly, the second support component 124 may bend and/or flex to allow the various components to fit and/or couple with each other. In some implementations, the first support component 842 may be touching the first support component 122. In some implementations, the second support component 844 may be touching the second support component 124.

In some implementations, the presence of the protrusions 920, the metal ground components (e.g., 862, 864), the metal components (e.g., 822, 824), and/or the support components (e.g., 122, 124, 842, 844) help provide a more secure and reliable coupling between a receptacle and a plug by providing adequate flexibility, tension and pressure between a receptacle and a plug. It is noted that interface 800 may have different numbers of the protrusions 920, the metal ground components (e.g., 862, 864), the metal components (e.g., 822, 824), and/or the support components (e.g., 122, 124, 842, 844). The interface 800 may have the protrusions 920, the metal ground components (e.g., 862, 864), the metal components (e.g., 822, 824), and/or the support components (e.g., 122, 124, 842, 844) located in different locations. The interface 800 may have different shapes, configurations and/or designs for the metal frame 120, the metal frame 140, the protrusions 920, the metal ground components (e.g., 862, 864), the metal components (e.g., 822, 824), and/or the support components (e.g., 122, 124, 842, 844).

The present disclosure describes an interface that allows two electrical currents (e.g., electrical signals) to travel through shielded electrical paths. However, the interface is not limited to just two shielded electrical paths. Some implementations may have more than two shielded electrical paths.

Figure 12:
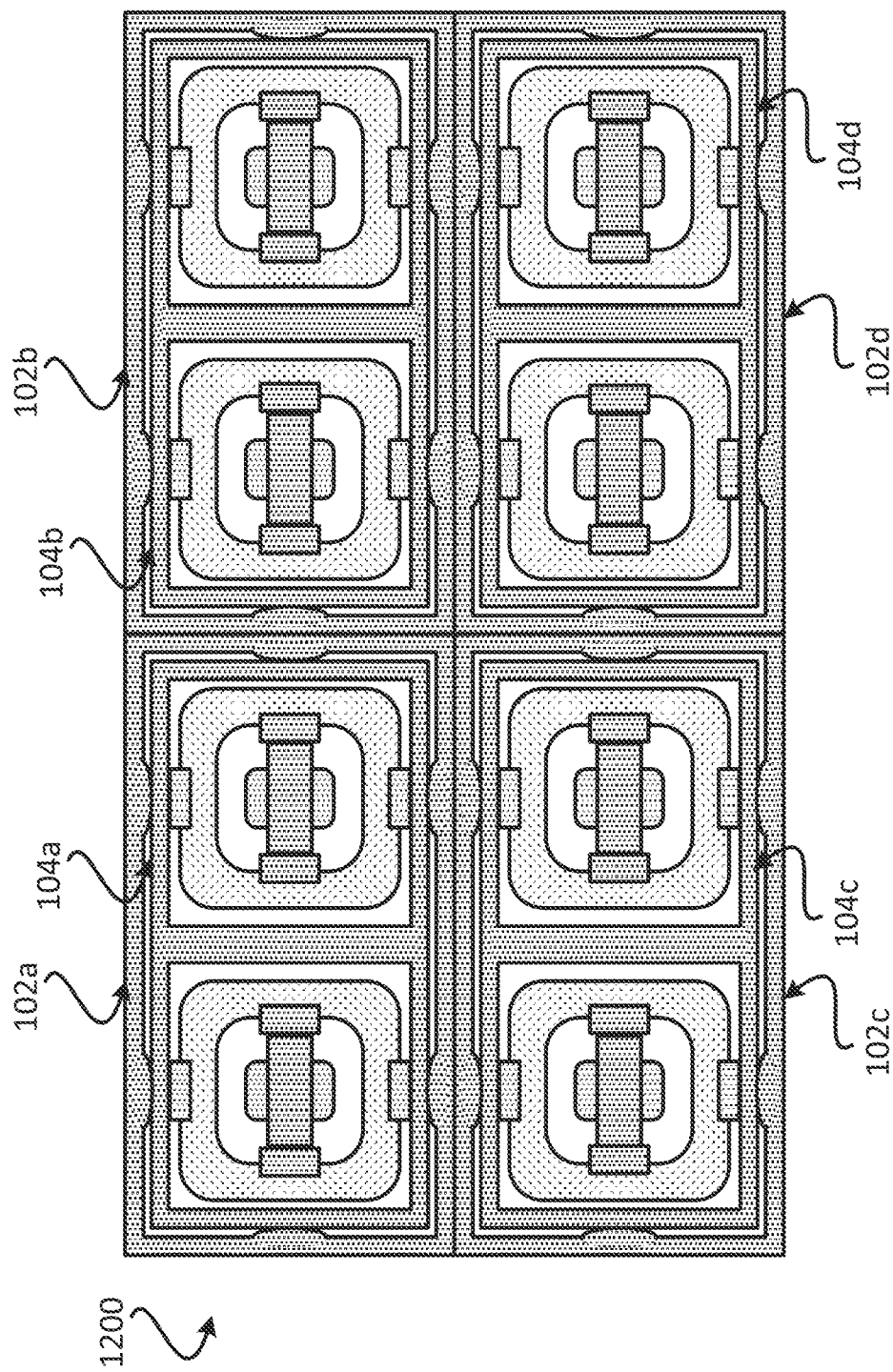
FIG. 12 illustrates a cross sectional view of a receptacle and a plug for another multi-line coaxial interface.

FIG. 12 illustrates an interface 1200 that includes several receptacles (e.g., 104a, 104b, 104c, 104d) and several plugs (e.g., 102a, 102b, 102c, 102e) configured to provide eight shielded electrical paths. The interface 1200 (which may be a multi-line coaxial interface) is arranged in an array of 2×4 for a total of eight shielded electrical paths. However, it is noted that different implementations may have different numbers and/or combinations of receptacles and/or plugs. For example, the array may be a 2×2 array or a 1×4 array. The interface 1200 may be one interface or several interfaces combined into one.

Figure 13:
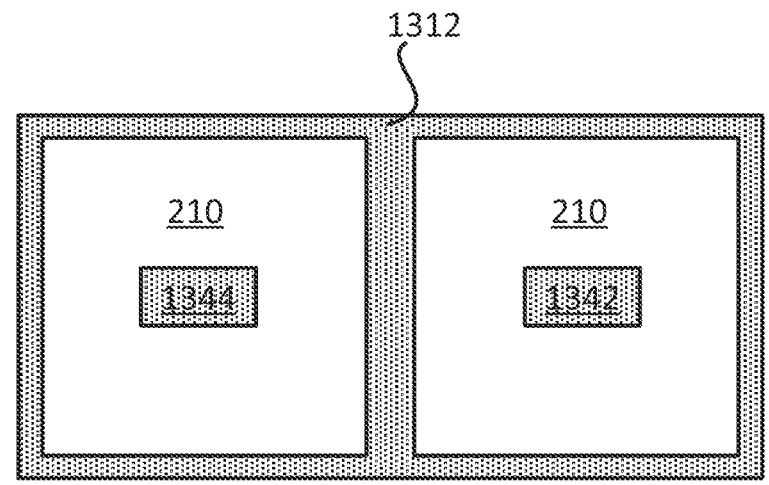
FIG. 13 illustrates a plan view of a portion of a board coupled to a plug for a multi-line coaxial interface.

FIG. 13 illustrates a plan view of a portion of the board 202. The portion of the board 202 that is shown may be the portion over which the receptacle 104 is coupled to when the receptacle 104 is coupled to the board 202. FIG. 13 illustrates a board 202 that includes a first interconnect 1342, a second interconnect 1344, the dielectric layer 210 and an interconnect 1312. The interconnect 1312 forms a rectangular shape in the board 202. The first interconnect 1342 may be configured to be coupled to the first metal component 142 of the receptacle 104. The second interconnect 1344 may be configured to be coupled to the second metal component 144 of the receptacle 104. The first interconnect 1342 and the second interconnect 1344 may be part of the plurality of interconnects 212. The interconnect 1312 may be configured to be coupled to the metal frame 140 of the receptacle 104. The interconnect 1312 may be part of the plurality of interconnects 212 and/or the metal layer 214.

Figure 14:
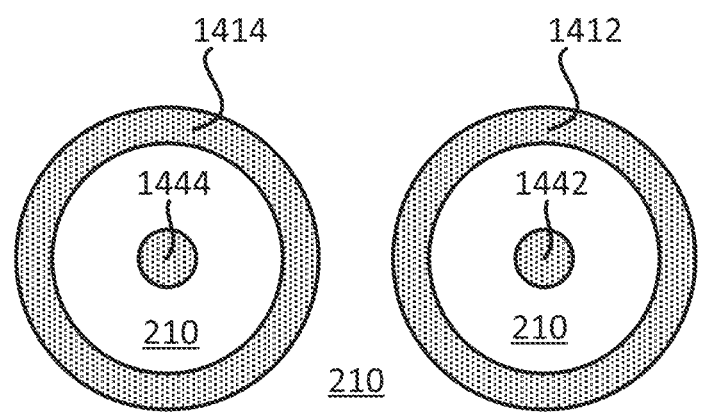
FIG. 14 illustrates a plan view of a portion of a board coupled to a plug for a multi-line coaxial interface.

FIG. 14 illustrates a plan view of a portion of the board 202. FIG. 14 illustrates a different design of the interconnects of the board 202 than the design shown in FIG. 13. FIG. 14 illustrates a board 202 that includes a first interconnect 1442, a second interconnect 1444, the dielectric layer 210, an interconnect 1412, and an interconnect 1414. The first interconnect 1442 may be configured to be coupled to the first metal component 142 of the receptacle 104. The second interconnect 1444 may be configured to be coupled to the second metal component 144 of the receptacle 104. The first interconnect 1442 and the second interconnect 1444 may be part of the plurality of interconnects 212. The interconnect 1412 and/or the interconnect 1414 may have a planar circular ring shape. The interconnect 1412 and/or the interconnect 1414 may be configured to be coupled to the metal frame 140 of the receptacle 104. The interconnect 1412 and/or the interconnect 1414 may be part of the plurality of interconnects 212 and/or the metal layer 214. In some implementations, instead of a dielectric layer or in conjunction with a dielectric layer, an encapsulation layer (e.g., mold, resin, epoxy) may be used. The configuration shown in FIGS. 13 and 14 may be applicable to a substrate.

It is noted that the disclosure describes the receptacle 104 as being coupled to the board 202 and the plug 102 as being coupled to the cable 106 (or is considered part of the cable 106). However, in some implementations, the plug 102 may be coupled to the board 202 and the receptacle 104 is coupled to the cable (or is considered part of the cable 106). In some implementations, the cable 106 (i) may be coupled to a receptacle 104 on one end (or have a receptacle 104 on one end) and (ii) may be coupled to a plug 102 on the other end (or have a plug 102 on the other end). Such a cable 106 may be used to couple to a board that includes a receptacle and another board that includes a plug. It is noted that the use of the terms "metal component" and/or "metal ground component" in the disclosure may mean a component that includes a metal material and/or an electrically conductive material. The metal component may include other materials that is non-metallic. Similarly, the use of the term "metal frame" in the disclosure may mean a component that includes a metal material and/or an electrically conductive material. The metal frame may include other materials that is non-metallic. A coaxial interface and/or a coaxial cable as used in the disclosure may be an interface and/or a cable that provides 360-degree shielding (e.g., 260-degree EMI shielding) across a cross section of an electrical path for an electrical signal. It is noted that instead of a board, the multi-line interface described in the disclosure may be coupled to a substrate that includes at least one dielectric layer, a plurality of interconnects. Examples of substrates include an embedded trace substrate (ETS), a coreless substrate, and a cored substrate. Different implementations may fabricate the substrate differently.

Figure 15:
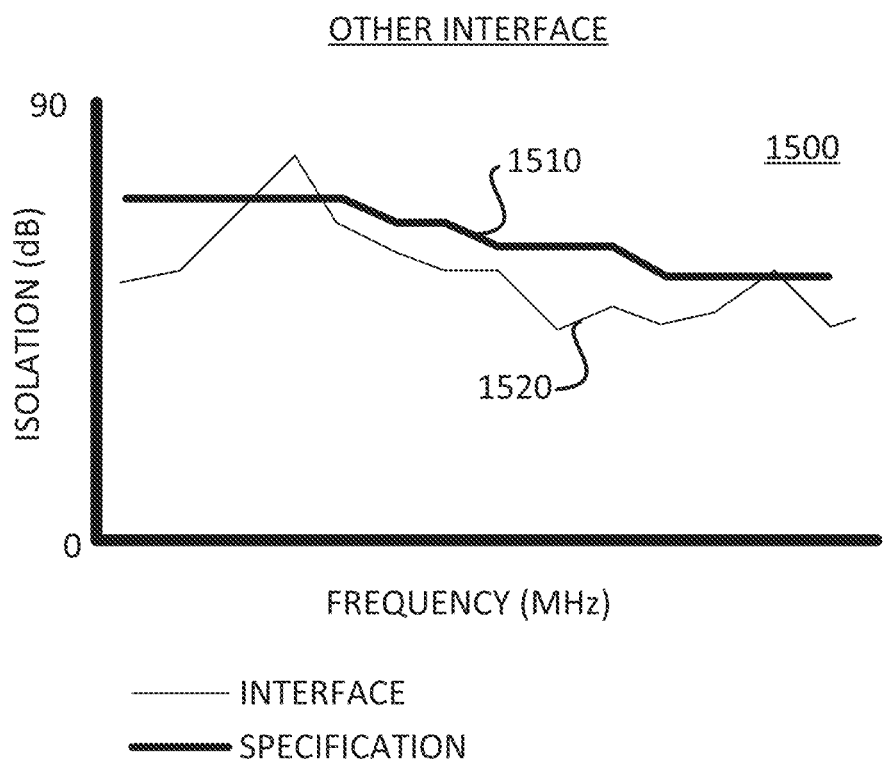
FIG. 15 illustrates a graph of the isolation performance of an interface for a cable.
Figure 16:
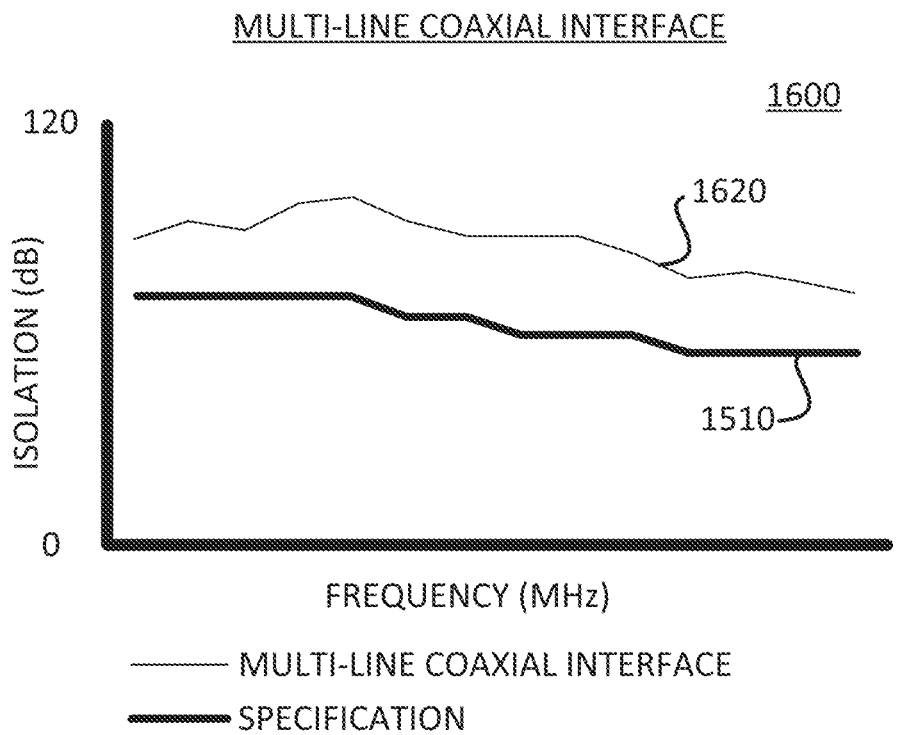
FIG. 16 illustrates a graph of the isolation performance of an interface for a multi-line coaxial cable.

FIGS. 15 and 16 illustrate graphs that show exemplary signal performances using different interfaces. FIG. 15 illustrates a graph 1500 that shows the isolation performance of a non-multi line coaxial interface. The graph 1500 illustrates the isolation performance for a reference profile 1510 and an interface profile 1520. As shown in FIG. 15, the isolation value for the interface profile 1520 may include portions that are lower than the reference profile 1510. The reference profile 1510 may be a minimum specification requirement for a device. A higher isolation (dB) value is better. As shown in FIG. 15, the interface associated with the interface profile 1520 does not meet the requirements as shown in the reference profile 1510.

FIG. 16 illustrates a graph 1600 that shows an exemplary isolation performance of a multi-line coaxial interface (e.g., 100, 800). The graph 1600 illustrates the isolation performance for a reference profile 1510 and the multi-line coaxial interface profile 1620. As shown in FIG. 16, the isolation value for the multi-line coaxial interface profile 1620 is higher than the reference profile 1510, along all frequencies shown in the graph 1600. Additionally, the multi-line coaxial interface profile 1620 is higher than the interface profile 1520 of FIG. 15. As mentioned above, a higher isolation (dB) value is better. FIG. 16 illustrates that the multi-line coaxial interface provides higher signal isolation (for the same frequency) than the non-multi line interface of FIG. 15, which can result in improved signal quality and integrity for signals traveling through a multi-line coaxial cable between boards and/or substrates. The results shown for the multi-line coaxial interface in FIG. 16 may be applicable to signals that have frequencies of up to 50 GHz. For example, a multi-line interface (e.g., 100, 800, 1200) may provide at least 70 dB of isolation for all signals having frequencies of up to 10 GHz traveling through the multi-line interface (e.g., between two boards coupled through a multi-line cable with multi-line interfaces, between two substrates coupled through a multi-line cable with multi-line interfaces).

Exemplary Electronic Devices

Figure 17:
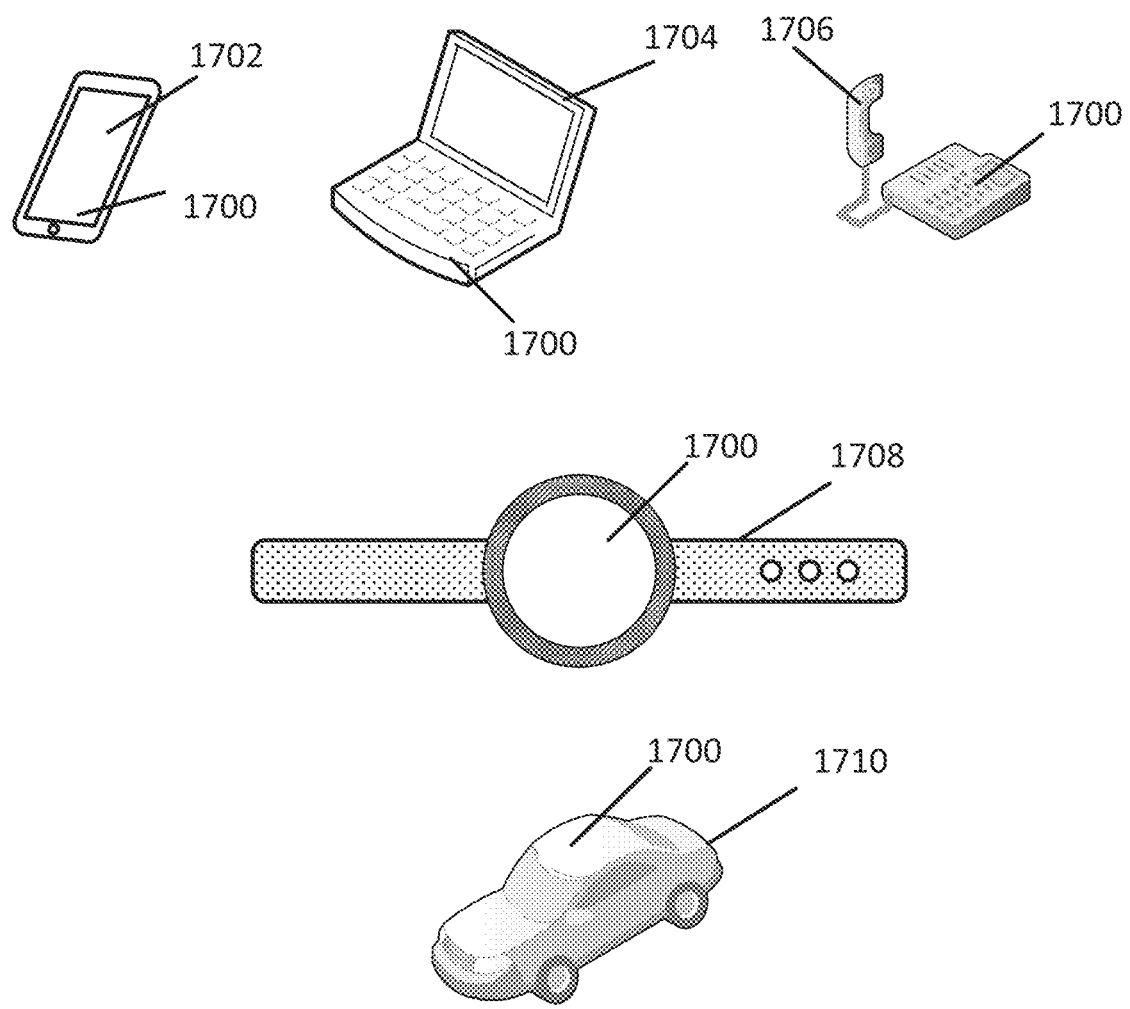
FIG. 17 illustrates various electronic devices that may integrate a die, an electronic circuit, an integrated device, an integrated passive device (IPD), a passive component, a package, and/or a device package described herein.

FIG. 17 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1702, a laptop computer device 1704, a fixed location terminal device 1706, a wearable device 1708, or automotive vehicle 1710 may include a device 1700 as described herein. The device 1700 may be, for example, any of the devices and/or integrated circuit (IC) packages described herein. The devices 1702, 1704, 1706 and 1708 and the vehicle 1710 illustrated in FIG. 17 are merely exemplary. Other electronic devices may also feature the device 1700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-14 and/or 17 may be rearranged and/or combined into a single component, process, feature or function or embodied in several components, processes, or functions. Additional elements, components, processes, and/or functions may also be added without departing from the disclosure. It should also be noted FIGS. 1-14 and/or 17 and its corresponding description in the present disclosure is not limited to dies and/or ICs. In some implementations, FIGS. 1-14 and/or 17 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit.

Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A device comprising a board and a multi-line interface coupled to the board. The multi-line interface includes a receptacle and a plug configured to the coupled to the receptacle. The receptacle includes a first receptacle metal component configured as part of a first electrical path for a first current, and a second receptacle metal component configured as part of a second electrical path for a second current. The plug includes a first plug metal component configured to be coupled to the first receptacle metal component, a second plug metal component configured to be coupled to the second receptacle metal component, and a plug metal frame configured as a shield around the first plug metal component and the second plug metal component.

Aspect 2: The device of aspect 1, wherein the multi-line interface includes a multi-line coaxial interface.

Aspect 3: The device of aspects 1 through 2, wherein the multi-line interface is configured to provide the first electrical path for the first current through the receptacle and the plug, and wherein the multi-line interface is configured to provide the second electrical path for the second current through the receptacle and the plug.

Aspect 4: The device of aspects 1 through 3, wherein the receptacle further comprises a receptacle metal frame configured to be coupled to the plug metal frame, wherein the plug metal frame is configured to surround the receptacle metal frame, and wherein the plug metal frame is configured to be coupled to ground.

Aspect 5: The device of aspect 4, wherein the plug further includes a first support component that surrounds the first plug metal component; and a second support component that surrounds the second plug metal component.

Aspect 6: The device of aspect 5, wherein the plug further includes a first metal ground component configured to be coupled to the receptacle metal frame, wherein the first metal ground component is configured to be located between the first support component and the receptacle metal frame; and a second metal ground component configured to be coupled to the receptacle metal frame, wherein the second metal ground component is configured to be located between the second support component and the receptacle metal frame.

Aspect 7: The device of aspects 1 through 6, wherein the plug is coupled to the board.

Aspect 8: The device of aspects 1 through 6, wherein the receptacle is coupled to the board.

Aspect 9: The device of aspects 1 through 8, further comprising a cable coupled to the multi-line interface; a second multi-line interface coupled to the cable, wherein the second multi-line interface comprises a second receptacle and a second plug, the second plug configured to be coupled to the second receptacle; and a second board coupled to the second multi-line interface.

Aspect 10: The device of aspect 9, wherein the multi-line interface and the second multi-line interface are part of the cable.

Aspect 11: The device of aspect 9, wherein the second receptacle comprises a third receptacle metal component configured as part of the first electrical path for the first current; a fourth receptacle metal component configured as part of the second electrical path for the second current; and a second receptacle metal frame configured as a shield around the third receptacle metal component and the fourth receptacle metal component of the second receptacle.

Aspect 12: The device of aspect 11, wherein the second plug comprises a third plug metal component configured to be coupled to the third receptacle metal component; a fourth plug metal component configured to be coupled to the fourth receptacle metal component; and a second plug metal frame configured as a shield around the third plug metal component and the fourth plug metal component.

Aspect 13: The device of aspect 12, wherein the receptacle is coupled to the board, and wherein the second receptacle is coupled to the second board.

Aspect 14: The device of aspect 12, wherein the plug is coupled to the board, and wherein the second plug is coupled to the second board.

Aspect 15: The device of aspect 12, wherein the receptacle is coupled to the board, and wherein the second plug is coupled to the second board.

Aspect 16: The device of aspects 1 through 15, wherein the plug metal frame includes at least one protrusion.

Aspect 17: The device of aspects 1 through 16, wherein the first electrical current and/or the second electrical current includes millimeter wave signals, radio frequency (RF) signals and/or intermediate frequency (IF) signals.

Aspect 18: The device of aspects 1 through 17, wherein the board comprises: at least one dielectric layer; a plurality of interconnects, wherein the plurality of interconnects is configured to be coupled to the first receptacle metal component and the second receptacle metal component; and a metal layer located on a surface of the at least one dielectric layer, wherein the metal layer is configured to be coupled to the plug metal frame, and wherein the metal layer is configured as being part of the shield.

Aspect 19: The device of aspect 18, wherein the first electrical path includes a first plurality of interconnects from the plurality of interconnects that is located in the at least one dielectric layer; and wherein the second electrical path includes a second plurality of interconnects from the plurality of interconnects that is located in the at least one dielectric layer.

Aspect 20: The device of aspects 1 through 19, wherein the device includes an electronic device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: An apparatus comprising a board and means for multi-line interface. The means for multi-line interface comprising means for receptacle coupling and means for plug coupling. The means for plug coupling configured to be coupled to the means for receptacle coupling. The means for multi-line interface configured to (i) provide a first electrical path for a first current, and (ii) provide a second electrical path for a second current. The means for plug coupling and the means for receptacle coupling are configured to provide electromagnetic interference (EMI) shielding for the first electrical path for the first current and for the second electrical path for the second current.

Aspect 22: An apparatus comprising a substrate and means for multi-line interface. The means for multi-line interface comprising means for receptacle coupling and means for plug coupling. The means for plug coupling configured to be coupled to the means for receptacle coupling. The means for multi-line interface configured to (i) provide a first electrical path for a first current, and (ii) provide a second electrical path for a second current. The means for plug coupling and the means for receptacle coupling are configured to provide electromagnetic interference (EMI) shielding for the first electrical path for the first current and for the second electrical path for the second current.

Aspect 23: A device comprising a substrate and a multi-line interface coupled to the substrate. The multi-line interface includes a receptacle and a plug configured to the coupled to the receptacle. The receptacle includes a first receptacle metal component configured as part of a first electrical path for a first current, and a second receptacle metal component configured as part of a second electrical path for a second current. The plug includes a first plug metal component configured to be coupled to the first receptacle metal component, a second plug metal component configured to be coupled to the second receptacle metal component, and a plug metal frame configured as a shield around the first plug metal component and the second plug metal component.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
  a multi-line interface comprising:
    (i) a receptacle comprising:
      a first receptacle metal component configured as part of a first electrical path for a first current; and
      a second receptacle metal component configured as part of a second electrical path for a second current; and
    (ii) a plug configured to be coupled to the receptacle, the plug comprising:
      a first plug metal component configured to be coupled to the first receptacle metal component;
      a second plug metal component configured to be coupled to the second receptacle metal component; and
      a plug metal frame configured as a shield around the first plug metal component and the second plug metal component; and
  a board coupled to the multi-line interface, wherein the board comprises:
    at least one dielectric layer;
    a plurality of interconnects configured to be coupled to the first receptacle metal component and the second receptacle metal component; and
    a metal layer located on a surface of the at least one dielectric layer,
      wherein the metal layer is configured to be coupled to the plug metal frame, and
      wherein the metal layer is configured as being part of the shield.

2. The device of claim 1, wherein the multi-line interface includes a multi-line coaxial interface.

3. The device of claim 1,
  wherein the multi-line interface is configured to provide the first electrical path for the first current through the receptacle and the plug, and
  wherein the multi-line interface is configured to provide the second electrical path for the second current through the receptacle and the plug.

4. The device of claim 1,
  wherein the receptacle further comprises a receptacle metal frame configured to be coupled to the plug metal frame,
  wherein the plug metal frame is configured to surround the receptacle metal frame, and
  wherein the plug metal frame is configured to be coupled to ground.

5. The device of claim 4, wherein the plug further comprises:
  a first support component that surrounds the first plug metal component; and
  a second support component that surrounds the second plug metal component.

6. The device of claim 5, wherein the plug further comprises:
  a first metal ground component configured to be coupled to the receptacle metal frame, wherein the first metal ground component is configured to be located between the first support component and the receptacle metal frame; and
  a second metal ground component configured to be coupled to the receptacle metal frame, wherein the second metal ground component is configured to be located between the second support component and the receptacle metal frame.

7. The device of claim 1, wherein the plug is coupled to the board.

8. The device of claim 1, wherein the receptacle is coupled to the board.

9. The device of claim 1, further comprising:
  a cable coupled to the multi-line interface;
  a second multi-line interface coupled to the cable, wherein the second multi-line interface comprises a second receptacle and a second plug, the second plug configured to be coupled to the second receptacle; and
  a second board coupled to the second multi-line interface.

10. The device of claim 9, wherein the multi-line interface and the second multi-line interface are part of the cable.

11. The device of claim 9, wherein the second receptacle comprises:
  a third receptacle metal component configured as part of the first electrical path for the first current;
  a fourth receptacle metal component configured as part of the second electrical path for the second current; and
  a second receptacle metal frame configured as a shield around the third receptacle metal component and the fourth receptacle metal component of the second receptacle.

12. The device of claim 11, wherein the second plug comprises:
a third plug metal component configured to be coupled to the third receptacle metal component;
a fourth plug metal component configured to be coupled to the fourth receptacle metal component; and
a second plug metal frame configured as a shield around the third plug metal component and the fourth plug metal component.

13. The device of claim 12,
wherein the receptacle is coupled to the board, and
wherein the second receptacle is coupled to the second board.

14. The device of claim 12,
wherein the plug is coupled to the board, and
wherein the second plug is coupled to the second board.

15. The device of claim 12,
wherein the receptacle is coupled to the board, and
wherein the second plug is coupled to the second board.

16. The device of claim 1, wherein the plug metal frame includes at least one protrusion.

17. The device of claim 1, wherein the first electrical current and/or the second electrical current includes millimeter wave signals.

18. The device of claim 1,
wherein the first electrical path includes a first plurality of interconnects from the plurality of interconnects,
wherein the first plurality of interconnects are located in the at least one dielectric layer;
wherein the second electrical path includes a second plurality of interconnects from the plurality of interconnects, and
wherein the second plurality of interconnects are located in the at least one dielectric layer.

19. The device of claim 1, wherein the device includes an electronic device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

20. A device comprising:
a board; and
a multi-line interface coupled to the board, the multi-line interface comprising:
(i) a receptacle comprising:
a first receptacle metal component configured as part of a first electrical path for a first current;
a second receptacle metal component configured as part of a second electrical path for a second current; and
a receptacle metal frame; and
(ii) a plug configured to be coupled to the receptacle, the plug comprising:
a first plug metal component configured to be coupled to the first receptacle metal component;
a second plug metal component configured to be coupled to the second receptacle metal component;
a plug metal frame configured as a shield around the first plug metal component and the second plug metal component,
wherein the plug metal frame is configured to be coupled to the receptacle metal frame,
wherein the plug metal frame is configured to surround the receptacle metal frame, and
wherein the plug metal frame is configured to be coupled to ground;
a first support component that surrounds the first plug metal component;
a second support component that surrounds the second plug metal component;
a first metal ground component configured to be coupled to the receptacle metal frame, wherein the first metal ground component is configured to be located between the first support component and the receptacle metal frame; and
a second metal ground component configured to be coupled to the receptacle metal frame, wherein the second metal ground component is configured to be located between the second support component and the receptacle metal frame.

* * * * *